United States Patent
Voronin et al.

(10) Patent No.: US 12,362,158 B2
(45) Date of Patent: Jul. 15, 2025

(54) METHOD FOR OES DATA COLLECTION AND ENDPOINT DETECTION

(71) Applicant: Tokyo Electron Limited, Tokyo (JP)

(72) Inventors: Sergey Voronin, Albany, NY (US); Blaze Messer, Albany, NY (US); Yan Chen, Fremont, CA (US); Joel Ng, Fremont, CA (US); Ashawaraya Shalini, Fremont, CA (US); Ying Zhu, Fremont, CA (US); Da Song, Fremont, CA (US)

(73) Assignee: Tokyo Electron Limited, Tokyo (JP)

( * ) Notice: Subject to any disclaimer, the term of this patent is extended or adjusted under 35 U.S.C. 154(b) by 176 days.

(21) Appl. No.: 17/972,958

(22) Filed: Oct. 25, 2022

(65) Prior Publication Data

US 2024/0136164 A1 Apr. 25, 2024
US 2024/0234111 A9 Jul. 11, 2024

(51) Int. Cl.
*H01J 37/32* (2006.01)
*G01J 3/443* (2006.01)
*H01L 21/67* (2006.01)

(52) U.S. Cl.
CPC ......... *H01J 37/32972* (2013.01); *G01J 3/443* (2013.01); *H01J 37/32146* (2013.01);
(Continued)

(58) Field of Classification Search
CPC ........... H01J 37/32972; H01J 37/32146; H01J 37/32926; H01J 37/32963;
(Continued)

(56) References Cited

U.S. PATENT DOCUMENTS 3,059,611 A 10/1962 Fury et al.
3,612,692 A 10/1971 Kruppa et al.
(Continued)

FOREIGN PATENT DOCUMENTS

CN 1482578 A 3/2004
CN 101038860 A 9/2007
(Continued)

OTHER PUBLICATIONS

De Schepper et al. "Pattern Roughness Mitigation of 22 nm Lines and Spaces: The Impact of a H2 Plasma Treatment" Plasma Processes and Polymers, Sep. 2014, 10 pages.
(Continued)

*Primary Examiner* — Anita K Alanko
(74) *Attorney, Agent, or Firm* — Slater Matsil, LLP

(57) ABSTRACT

A method of processing a substrate that includes: exposing the substrate in a plasma processing chamber to a plasma powered by applying a first power to a first electrode of the plasma processing chamber for a first time duration; and after the first time duration, determining a process endpoint by: while exposing the substrate to the plasma by applying the first power to the first electrode, applying a second power to a second electrode of the plasma processing chamber for a second time duration that is shorter than the first time duration; and obtaining an optical emission spectrum (OES) from the plasma while applying the second power to the second electrode, where an energy of the second power over the second time duration is less than an energy of the first power over a sum of the first and the second time durations by a factor of at least 2.

20 Claims, 8 Drawing Sheets

(52) U.S. Cl.
CPC .. *H01J 37/32926* (2013.01); *H01J 37/32963* (2013.01); *H01L 21/67253* (2013.01)

(58) Field of Classification Search
CPC ......... H01J 37/32091; H01L 21/67253; H01L 21/67109; G01J 3/443
USPC .................. 438/9, 16, 689, 710; 216/60, 67; 356/316
See application file for complete search history.

(56) References Cited

U.S. PATENT DOCUMENTS

| | | | |
|---|---|---|---|
| 4,147,435 A | 4/1979 | Habegger | |
| 5,014,217 A | 5/1991 | Savage | |
| 5,308,414 A | 5/1994 | O'Neill et al. | |
| 5,347,460 A | 9/1994 | Gifford et al. | |
| 5,353,790 A | 10/1994 | Jacques et al. | |
| 5,450,205 A | 9/1995 | Sawin et al. | |
| 5,517,312 A | 5/1996 | Finarov | |
| 5,648,198 A | 7/1997 | Shibata | |
| 5,658,423 A | 8/1997 | Angell et al. | |
| 5,751,416 A | 5/1998 | Singh et al. | |
| 5,807,761 A | 9/1998 | Coronel et al. | |
| 5,885,472 A | 3/1999 | Miyazaki et al. | |
| 5,980,767 A | 11/1999 | Koshimizu et al. | |
| 6,060,328 A | 5/2000 | En et al. | |
| 6,081,334 A | 6/2000 | Grimbergen et al. | |
| 6,090,302 A | 7/2000 | Smith, Jr. et al. | |
| 6,132,577 A | 10/2000 | Smith, Jr. et al. | |
| 6,374,832 B2 | 4/2002 | Chow et al. | |
| 6,381,008 B1 | 4/2002 | Branagh et al. | |
| 6,535,779 B1 | 3/2003 | Birang et al. | |
| 6,564,114 B1 | 5/2003 | Toprac et al. | |
| 6,582,618 B1 | 6/2003 | Toprac et al. | |
| 6,673,200 B1 | 1/2004 | Gu et al. | |
| 6,703,250 B2 | 3/2004 | Chiu | |
| 6,745,095 B1 | 6/2004 | Ben-Dov et al. | |
| 6,815,653 B2 | 11/2004 | Tsay et al. | |
| 6,825,920 B2 | 11/2004 | Lam et al. | |
| 6,830,939 B2 | 12/2004 | Harvey et al. | |
| 6,911,157 B2 | 6/2005 | Edamura et al. | |
| 6,952,657 B2 | 10/2005 | Jahns et al. | |
| 6,958,484 B2 | 10/2005 | Mitrovic | |
| 6,969,619 B1 | 11/2005 | Winniczek | |
| 7,030,335 B2 | 4/2006 | Hoffman et al. | |
| 7,241,397 B2 | 7/2007 | Fink et al. | |
| 7,312,865 B2 | 12/2007 | Chen | |
| 7,328,126 B2 | 2/2008 | Chamness | |
| 7,334,477 B1 | 2/2008 | Pirkle | |
| 7,403,930 B2 | 7/2008 | Ho | |
| 7,591,923 B2 | 9/2009 | Mitrovic et al. | |
| 7,906,032 B2 | 3/2011 | Yamashita | |
| 7,959,970 B2 | 6/2011 | Gaudet et al. | |
| 8,048,326 B2 | 11/2011 | Yue et al. | |
| 8,154,721 B2 | 4/2012 | Chen et al. | |
| 8,158,017 B2 | 4/2012 | Hudson | |
| 8,173,451 B1 | 5/2012 | Tian et al. | |
| 8,223,329 B2 | 7/2012 | Park et al. | |
| 8,415,884 B2 | 4/2013 | Chen et al. | |
| 8,416,509 B2 | 4/2013 | Yi et al. | |
| 8,486,290 B2 | 7/2013 | Morisawa et al. | |
| 8,513,583 B2 | 8/2013 | Corke et al. | |
| 8,553,218 B2 | 10/2013 | Tinnemans et al. | |
| 8,877,080 B2 | 11/2014 | Chen et al. | |
| 8,883,024 B2 | 11/2014 | Chen et al. | |
| 9,200,950 B2 | 12/2015 | Lian et al. | |
| 9,209,950 B2 | 12/2015 | Luo et al. | |
| 9,330,990 B2 | 5/2016 | Chen et al. | |
| 9,564,295 B2 | 2/2017 | Lee et al. | |
| 9,760,008 B2 | 9/2017 | Devilliers | |
| 9,842,726 B2 | 12/2017 | Daniels et al. | |
| 9,899,278 B2 | 2/2018 | Ishikawa | |
| 10,436,717 B2 | 10/2019 | Omstead et al. | |
| 10,453,653 B2 | 10/2019 | Chen et al. | |
| 10,692,705 B2 | 6/2020 | Mihaylov et al. | |
| 2001/0046769 A1 | 11/2001 | Chow et al. | |
| 2002/0029851 A1 | 3/2002 | Edamura et al. | |
| 2003/0005943 A1 | 1/2003 | Singh et al. | |
| 2003/0132195 A1 | 7/2003 | Edamura et al. | |
| 2004/0008336 A1 | 1/2004 | Lam et al. | |
| 2004/0026035 A1 | 2/2004 | Mitrovic | |
| 2004/0058359 A1 | 3/2004 | Mei et al. | |
| 2004/0104681 A1 | 6/2004 | Mitrovic et al. | |
| 2004/0235303 A1 | 11/2004 | Wong et al. | |
| 2005/0241669 A1 | 11/2005 | Wodecki | |
| 2006/0006139 A1 | 1/2006 | Johnson | |
| 2006/0285108 A1 | 12/2006 | Morrisroe | |
| 2007/0128876 A1 | 6/2007 | Fukiage | |
| 2007/0238199 A1 | 10/2007 | Yamashita | |
| 2008/0186473 A1 | 8/2008 | Lee | |
| 2008/0285202 A1 | 11/2008 | Boyd et al. | |
| 2009/0029489 A1 | 1/2009 | Park et al. | |
| 2009/0065025 A1 | 3/2009 | Urbanowicz et al. | |
| 2009/0280581 A1 | 11/2009 | Hudson | |
| 2009/0325387 A1 | 12/2009 | Chen et al. | |
| 2010/0081285 A1 | 4/2010 | Chen et al. | |
| 2011/0139748 A1 | 6/2011 | Donnelly et al. | |
| 2011/0174776 A1 | 7/2011 | Kabe et al. | |
| 2012/0006351 A1 | 1/2012 | Jun et al. | |
| 2012/0085494 A1 | 4/2012 | Uchida et al. | |
| 2012/0091097 A1 | 4/2012 | Chen et al. | |
| 2012/0101622 A1 | 4/2012 | Yun et al. | |
| 2012/0175060 A1 | 7/2012 | Hudson et al. | |
| 2013/0016344 A1 | 1/2013 | Bullock et al. | |
| 2013/0141720 A1 | 6/2013 | Park et al. | |
| 2014/0097359 A1 | 4/2014 | Vasic et al. | |
| 2014/0106477 A1 | 4/2014 | Chen et al. | |
| 2014/0209453 A1 | 7/2014 | Jun et al. | |
| 2015/0069912 A1 | 3/2015 | Valcore, Jr. et al. | |
| 2015/0160557 A1 | 6/2015 | deVilliers | |
| 2015/0241272 A1 | 8/2015 | Lian et al. | |
| 2016/0126068 A1* | 5/2016 | Lee .................. | H01J 37/32935 156/345.24 |
| 2016/0233135 A1 | 8/2016 | Ishikawa | |
| 2016/0268108 A1 | 9/2016 | Daniels et al. | |
| 2016/0314943 A1 | 10/2016 | Albarede et al. | |
| 2019/0259580 A1 | 8/2019 | Cho et al. | |
| 2020/0058470 A1* | 2/2020 | Ventzek ............ | H01L 21/67069 |
| 2021/0057195 A1 | 2/2021 | Chen et al. | |
| 2021/0249225 A1* | 8/2021 | Ranjan ............. | H01L 21/31116 |
| 2024/0094056 A1* | 3/2024 | Voronin .................. | G01J 3/443 |
| 2024/0133742 A1* | 4/2024 | Voronin ............ | H01J 37/32146 |

FOREIGN PATENT DOCUMENTS

| | | | |
|---|---|---|---|
| CN | 101221891 A | 7/2008 | |
| CN | 102788916 A | 11/2012 | |
| CN | 102282654 B | 10/2013 | |
| CN | 103117202 B | 9/2015 | |
| EP | 0756318 A1 | 1/1997 | |
| EP | 0652415 B1 | 12/1998 | |
| JP | H05226296 A | 9/1993 | |
| JP | H08106992 A | 4/1996 | |
| JP | H09266097 A | 10/1997 | |
| JP | 2005527984 A | 9/2005 | |
| JP | 2015532544 A | 11/2015 | |
| JP | 2016146384 A | 8/2016 | |
| JP | 2016541119 A | 12/2016 | |
| KR | 100892248 B1 | 4/2009 | |
| KR | 20120126418 A | 11/2012 | |
| KR | 20160052173 A | 5/2016 | |
| TW | 589659 B | 6/2004 | |
| TW | 201435621 A | 9/2014 | |
| WO | 02091453 A1 | 11/2002 | |
| WO | 2005111265 A1 | 11/2005 | |
| WO | 2015130433 A1 | 9/2015 | |

OTHER PUBLICATIONS

Economou, "Pulsed plasma etching for semiconductor manufacturing", Journal of Physics D: Appl Physics, vol. 47, 303001, Jul. 1, 2014, 27 pages.

(56) References Cited

OTHER PUBLICATIONS

Goodlin, "Multivariate Endpoint Detection of Plasma Etching Processes" Dissertation presented Apr. 2002, at Massachusetts Institute of Technology, pp. 1-226.

Goodlin et al. "Quantitative Analysis and Comparison of Endpoint Detection Based on Multiple Wavelength Analysis" 201st Meeting of the Electrochemical Society, International Symposium on Plasma Processing XIV, Abs. 415, May 2002, pp. 1-30.

Lee, Master's Thesis presented at University of California, Berkeley, Jul. 1, 2000, 69 pages.

Park et al. "Electron characterization in weakly ionized collisional plasmas: from principles to techniques", Advances in Physics, vol. 4, No. 1, 1526114, Oct. 23, 2018, 53 pages.

Selwyn, "Optical Diagnostic Techniques for Plasma Processing" AVS Press, 1993, Relevant chapter 3 on Optical Emission Spectroscopy (OES) is provided, pp. 26-80 with title and bibliographic information pages.

Shannon et al. "A Spatially Resolved Optical Emission Sensor Plasma Etch Monitoring" Appl. Phys. Lett., vol. 71 No. 11, Sep. 1997, pp. 1467-1468.

Ventzek et al. "Formation, Nature, and Stability of the Arsenic-Silicon-Oxygen Alloy for Plasma Doping of Non-Planar Silicon Structures" Applied Physics letters, vol. 105, 2014, pp. 262102-1-262102.

White, "Multivariate Analysis of Spectral Measurements for the Characterization of Semiconductor Processes" Dissertation presented Apr. 2002, at Massachusetts Institute of Technology, pp. 1-357.

White et al. "Low-Open Area Endpoint Detection using a PCA based T2 Statistic and Q Statistic on Optical Emission Spectroscopy Measurements" IEEE Transactions on Semiconductor Manufacturing, vol. 13 No. 2, May 2000, pp. 1-30.

Yamaguchi et al. "Direct current superposed dual-frequency capacitively coupled plasmas in selective etching of SiOCH over SiC", Journal of Physics D Applied Physics, Dec. 2011, 25 pages.

Yue et al. "Plasma Etching Endpoint Detection Using Multiple Wavelengths for Small Open-Area Wafers" J. Vac. Sci. Technol. A, vol. 19 No. 1, 2001, pp. 66-75.

International Search Report and Written Opinion, PCT Application No. PCT/US2023/029880, mailed Nov. 21, 2023, 10 pages.

* cited by examiner

METHOD FOR OES DATA COLLECTION AND ENDPOINT DETECTION

CROSS-REFERENCE TO RELATED APPLICATIONS

This application is related to application filed on Oct. 25, 2022 (U.S. Pat. No. 12,158,374), which application is hereby incorporated herein by reference.

TECHNICAL FIELD

The present invention relates generally to systems and methods of processing a substrate, and, in particular embodiments, to optical emission spectroscopy data collection and endpoint detection.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Process flows used to form the constituent structures of semiconductor devices often involve depositing and removing a variety of materials while a pattern of several materials may be exposed in a surface of the working substrate.

Advanced process control that involves in-situ process characterization and fault detection in semiconductor manufacturing is essential for reproducible production of complex structures. As the minimum dimension of features in a patterned layer has shrunk periodically and new materials have been introduced in ICs, the need for improved process characterization to assure process compliance and cost reduction has increased.

SUMMARY

In accordance with an embodiment of the present invention, a method of processing a substrate that includes: exposing the substrate in a plasma processing chamber to a plasma powered by applying a first power to a first electrode of the plasma processing chamber for a first time duration; and after the first time duration, determining a process endpoint, the determining including: while exposing the substrate to the plasma by applying the first power to the first electrode, applying a second power to a second electrode of the plasma processing chamber for a second time duration, the second time duration being shorter than the first time duration; and obtaining an optical emission spectrum (OES) from the plasma while applying the second power to the second electrode, where an energy of the second power over the second time duration is less than an energy of the first power over a sum of the first time duration and the second time duration by a factor of at least 2.

In accordance with an embodiment of the present invention, a method of processing a substrate with a plasma process that includes: exposing the substrate in a plasma processing chamber to a plasma powered by applying a first power to a first electrode of the plasma processing chamber; while exposing the substrate to the plasma by applying the first power to the first electrode, applying a second power including a waveform having a frequency; periodically detecting optical emission spectra (OES) from the plasma, the OES being detected at time periods correlated to the frequency of the waveform; and detecting a process endpoint based on the periodic detection of the OES.

In accordance with an embodiment of the present invention, a plasma processing system that includes: a plasma processing chamber configured to hold a substrate to be processed; a RF power source configured to sustain a plasma in the plasma processing chamber; an optical emission spectroscopy (OES) detection device connected to the plasma processing chamber, the OES detection device being configured to measure OES signals from the plasma during a plasma process; a microprocessor; and a non-transitory memory storing a program to be executed in the microprocessor, the program including instructions to: power the RF power source to sustain the plasma using a RF source power for a first time duration; and perform a process endpoint detection, the process endpoint detection including: while sustaining the plasma with the RF source power, apply a series of power pulses to an electrode of the plasma processing chamber for a second time duration, where a total energy of the series of power pulses over the second time duration is less than an energy of the RF source power over the first time duration by a factor of at least 2; detecting a series of optical emission spectra (OES) from the plasma, a timing of the OES detection being correlated to a timing of power pulses; and determine if the process has reached to the endpoint based on the series of OES.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3A-3C illustrates example timing diagrams for a plasma process synchronized with power pulsing for OES signal enhancement in accordance with various embodiments, wherein FIG. 3A illustrates an embodiment with constant high power pulsing, FIG. 3B illustrates another embodiment with power spike ramping, and FIG. 3C illustrates an alternate embodiment with a varying duty ratio for power pulsing;

FIGS. 4A-4C illustrates example experimental data obtained by the method for OES data collection with power pulsing (4 s cycle) in accordance with one embodiment, wherein FIG. 4A illustrates a temporal profile of raw OES signal intensity at 777 nm for detection of oxygen, FIG. 4B illustrates a plot of the processed data of FIG. 4A with stepwise transitions, and FIG. 4C illustrates a plot of the processed data of FIG. 4A with smooth curve transitions;

FIGS. 5A-5C illustrates example experimental data obtained by the method for OES data collection with power pulsing (7 s cycle) in accordance with one embodiment, wherein FIG. 5A illustrates a temporal profile of raw OES signal intensity at 777 nm for detection of oxygen, FIG. 5B illustrates a plot of the processed data of FIG. 5A with stepwise transitions, and FIG. 5C illustrates a plot of the processed data of FIG. 5A with smooth curve transitions;

FIGS. 6A and 6B illustrates process flow charts of methods of OES data collection in accordance with various embodiments, wherein FIG. 6A illustrates an embodiment, and FIG. 6B illustrates another embodiment.

DETAILED DESCRIPTION OF ILLUSTRATIVE EMBODIMENTS

This application relates to systems and methods of process characterization, more particularly to optical emission spectroscopy (OES) for advanced process characterization. In semiconductor manufacturing, plasma processing is used at various stages for depositing and etching various materials to construct complex structures with precision at nanometer scale. Because a plasma is a highly energetic and complex system comprising ion and radical species, it is often challenging to accurately characterize the plasma during operation and monitor the progress of a plasma process. Optical emission spectroscopy (OES) is a powerful spectroscopic tool to analyze atoms and ions present in a plasma by detecting optical emission from excited species, and OES systems have been incorporated to some plasma processing systems for process characterization as described in, for example, in U.S. Pat. Nos. 5,862,060 and 10,453,653.

For example, using OES to collect light emission signal from process plasmas, endpoint detection (EPD) of a plasma etch process such as reactive ion etching (RIE) and atomic layer etching (ALE) may be achieved. EPD is used to stop or change plasma etching processes by detecting that the material being etched has been cleared to an underlying layer. Depending on the types of materials being etched and the etch process parameters, a change of an optical emission spectrum of plasma at or near an endpoint of the etch process may be subtle and relatively difficult to detect. Etching of the material with a low open ratio, for example, may make EPD difficult using current algorithms for processing optical emission spectroscopy (OES) data. Further, some etch process conditions require very mild or even zero plasma discharge, leading to limited sensitivity of existing OES EPD systems due to insufficient excitation for optical emissions. Improvements are therefore needed to make etch EPD based on OES data more robust in such challenging etch process conditions.

Embodiments of the present application disclose improved methods of OES data collection for endpoint detection (EPD), in which short duty power spikes are provided to the plasma for OES signal enhancement. Because of their low duty, these power spikes advantageously make negligible increase of the time-averaged power, resulting in minimum impact on the plasma process. The methods can further comprise excitation power modulation during the acquisition time periods, which enables retrieving additional information on reactions in the plasma. Although this disclosure primarily describes the embodiments of OES data collection for EPD of a plasma process, in certain embodiments, the methods may also be applied to a plasmas-less process where a plasma discharge is only present during OES data collection.

Figure 5A:
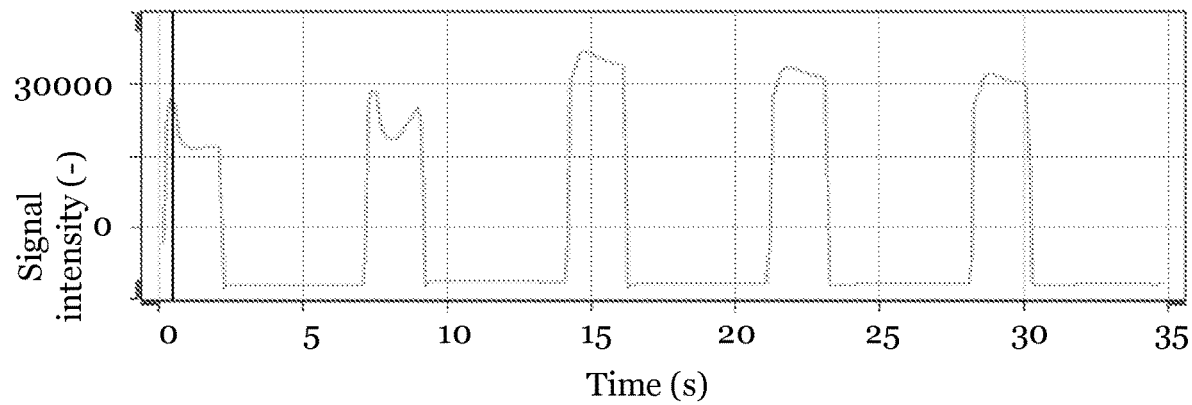
Figure 5B:
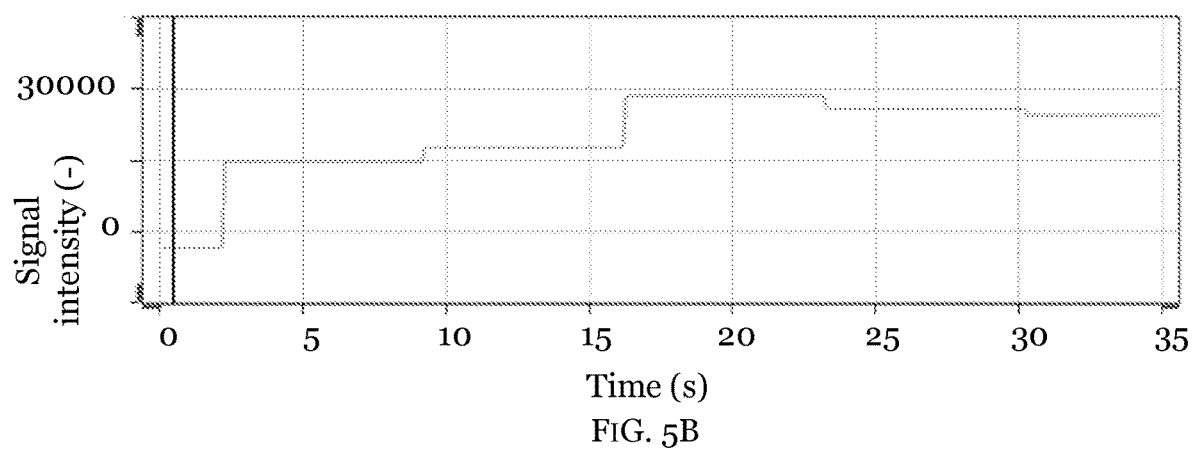
Figure 5C:
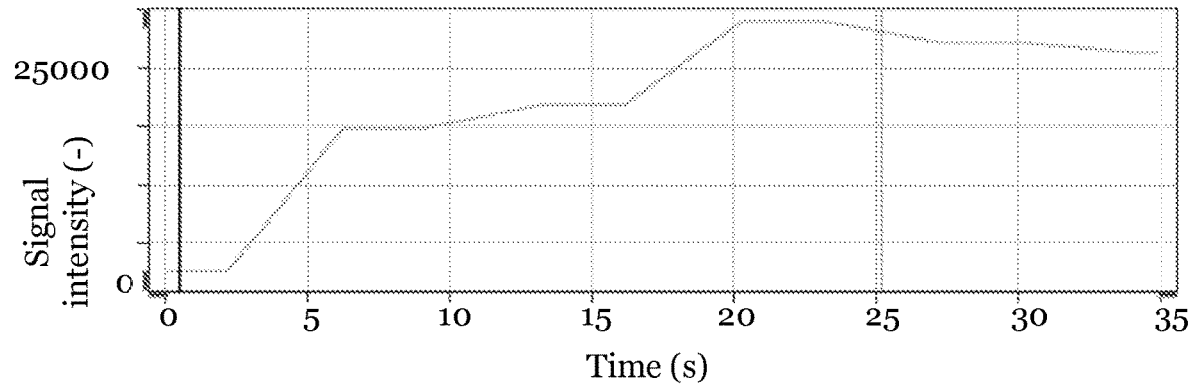
Figure 6A:
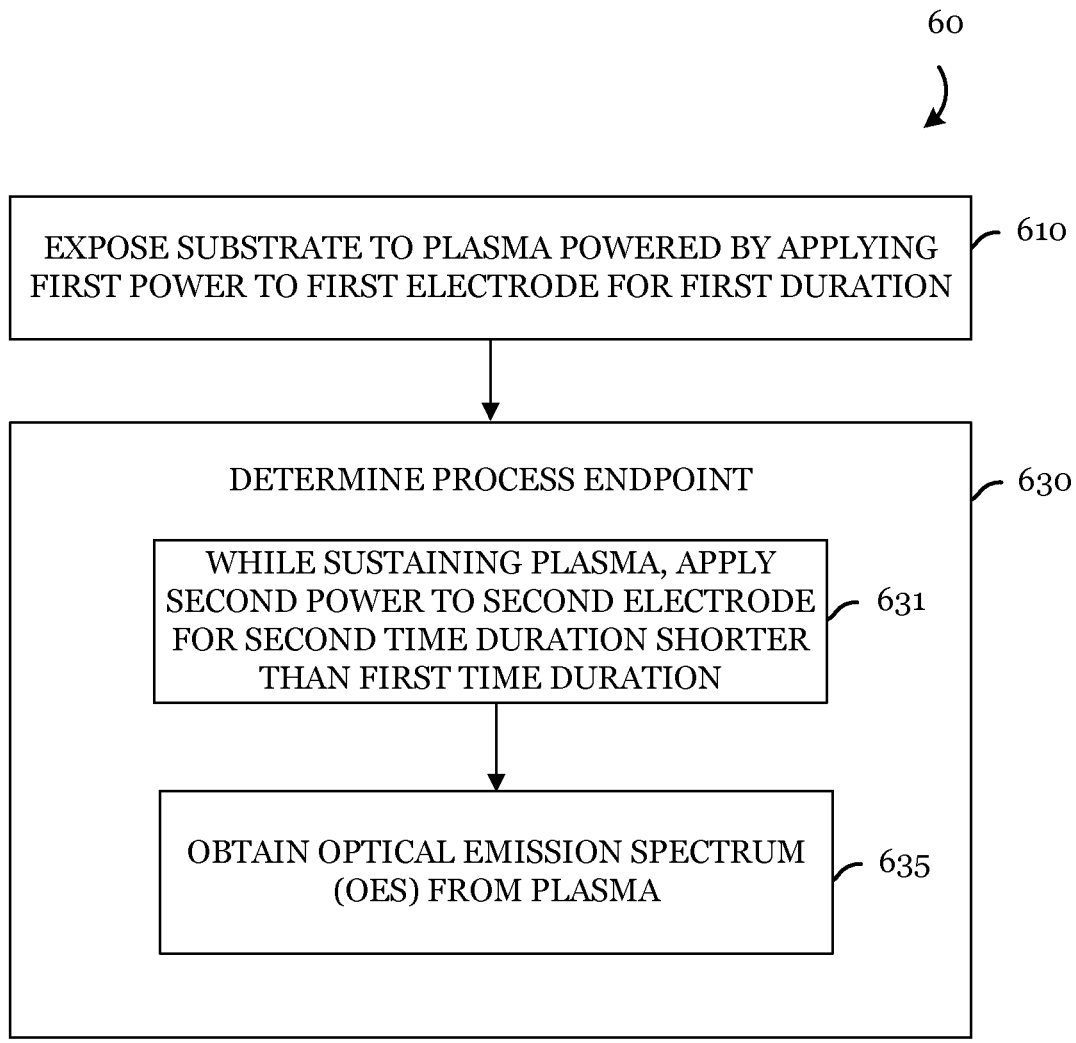
Figure 6B:
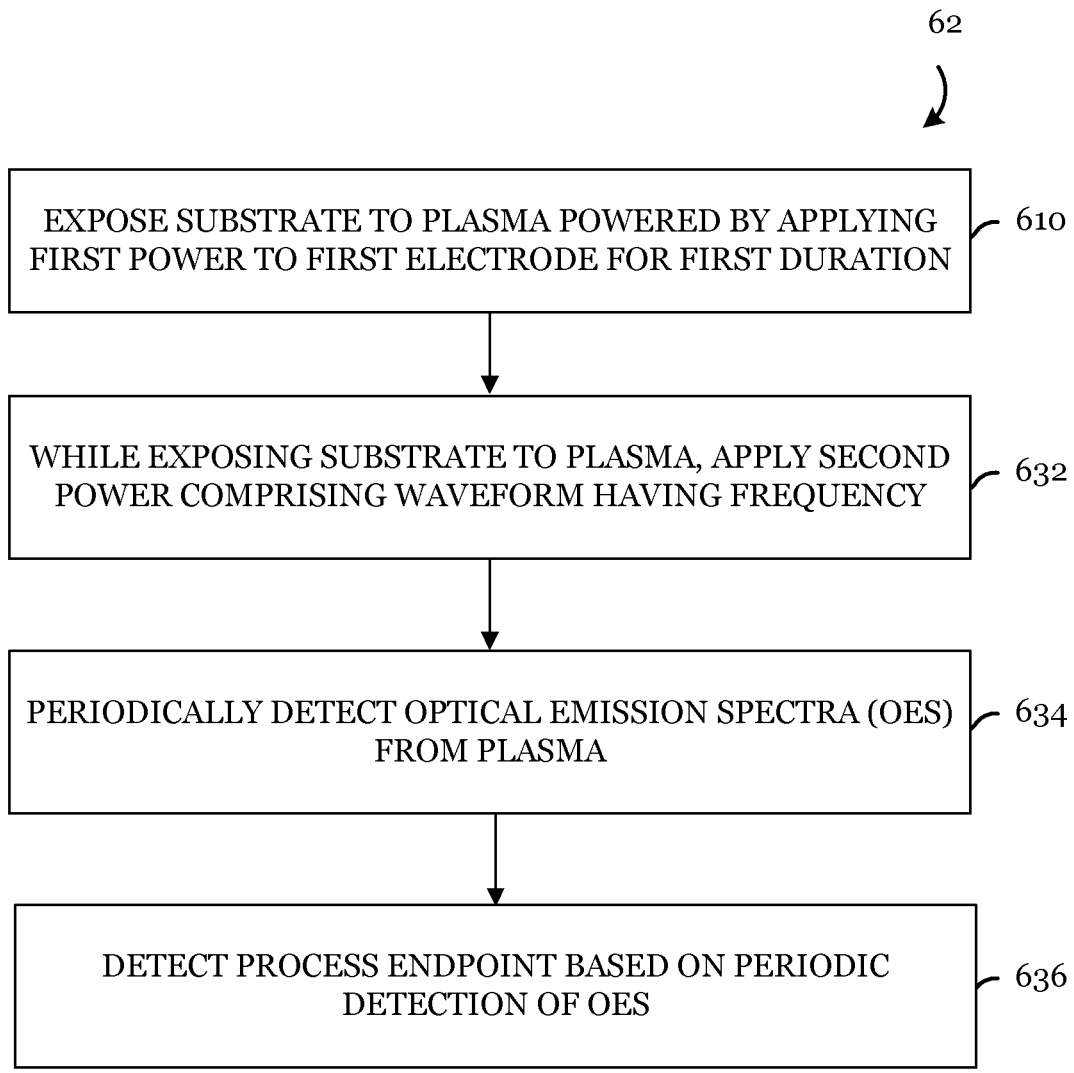

In the following, an example plasma processing system and OES detection device are described referring to FIGS. 1 and 2, respectively. Example time diagrams for power pulsing for OES signal enhancement are then described referring to FIGS. 3A-3C. Example experimental data of process characterization based on the methods are presented in FIGS. 4A-4C and 5A-5C. Example process flow diagrams are illustrated in FIGS. 6A and 6B. All figures in this disclosure are drawn for illustration purpose only and not to scale.

Figure 1:
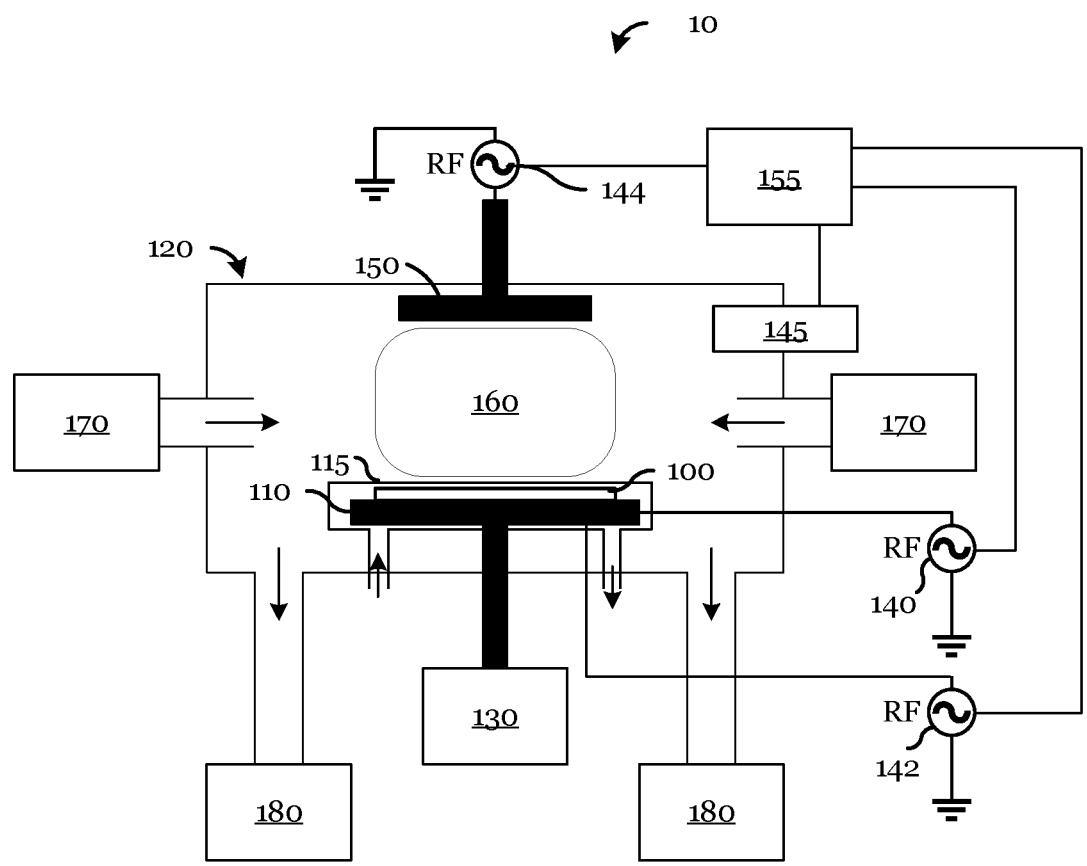
FIG. 1 illustrates an example plasma processing system with an optical emission spectroscopy (OES) configured to operate in synchronization with plasma processing in accordance with various embodiments.

FIG. 1 illustrates an example plasma processing system 10 with an OES configured to operate in synchronization with plasma processing in accordance with various embodiments.

For illustrative purposes, FIG. 1 illustrates a substrate 100 placed on a substrate holder 110 (e.g., a circular electrostatic chuck (ESC)) inside a plasma processing chamber 120 near the bottom. The substrate 100 may be optionally maintained at a desired temperature using a heater/cooler 115 that surrounds the substrate holder 110. The temperature of the substrate 100 may be maintained by a temperature controller 130 connected to the substrate holder 110 and the heater/cooler 115. The ESC may be coated with a conductive material (e.g., a carbon-based or metal-nitride based coating) so that electrical connections may be made to the substrate holder 110.

Process gases may be introduced into the plasma processing chamber 120 by a gas delivery system 170. The gas delivery system 170 comprises multiple gas flow controllers to control the flow of multiple gases into the chamber. Each of the gas flow controllers of the gas delivery system 170 may be assigned for each of fluorocarbons, noble gases, and/or balancing agents. In some embodiments, optional center/edge splitters may be used to independently adjust the gas flow rates at the center and edge of the substrate 100. The process gases or any exhaust gases may be evacuated from the plasma processing chamber 120 using vacuum pumps 180.

As illustrated in FIG. 1, the substrate holder 110 may be a bottom electrode of the plasma processing chamber 120. In the illustrative example in FIG. 1, the substrate holder 110 is connected to two RF power sources, 140 and 142. In some embodiment, a conductive circular plate inside the plasma processing chamber 120 near the top is the top electrode 150. In FIG. 1, the top electrode 150 is connected to another RF power source 144 of the plasma processing system 10. In various embodiments, all of power sources for plasma processing (e.g., RF power sources 140, 142, and 144) are connected to a control unit 155 to enable a synchronized operation of the power sources. Further, the control unit 155 is also connected to an OES detection device 145. The OES detection device 145 may be disposed at a position to measure the optical emission from the processing region of a plasma 160 between the substrate 100 and the top electrode 150.

In various embodiments, the control unit 155 is configured to enable feedback control of a plasma process, for example, based on a process monitoring using the OES methods. The control unit 155 may comprise a function generator including an appropriate digital and/or analog circuitry such as oscillators, pulse generators, modulators, combiners, and the like. The function generator is capable of generating one or more arbitrary waveforms that may be used for both power modulation of the RF power sources and OES data acquisition. In certain embodiments, some of the power modulation may be performed by the RF power sources themselves instead of the function generator. In such cases, the function generator may generate a pulse train synchronized with the power modulation by the RF power sources for OES data acquisition. In certain embodiments, although not illustrated, additional components (e.g., a broadband amplifier and a broadband impedance matching network) may be connected to the RF power sources.

In certain embodiments, power sources may comprise a DC power source. The RF and/or DC power sources (e.g., the RF power sources 140, 142, and 144) may be configured to generate a continuous wave (CW) RF, pulsed RF, DC, pulsed DC, a high frequency rectangular (e.g., square wave) or triangular (e.g., sawtooth) pulse train, or a combination or superposition of more than one such waveform. In addition, power sources may be configured to generate a periodic function, for example, a sinusoid whose characteristics such as amplitude and frequency may be adjusted during a plasma process.

A typical frequency for the RF source power can range from about 0.1 MHz to about 6 GHz. In certain embodiments, the RF power sources 142 and 144 may be used to provide a low frequency RF power and a high frequency RF power at the same time, respectively.

In this disclosure, the methods of OES are primarily directed to endpoint detection (EPD) of a plasma etch process. In certain embodiments, the plasma etch process may be carried out using a pulsed plasma. The pulsed plasma in this disclosure refers to any type of plasma where a source power, a bias power, or both is pulsed at any frequency. In various embodiments, a pulsing at a frequency between 0.1 kHz and 100 kHz may be used to modulate the plasma source power or the bias power. In certain embodiments, a RF pulsing at a kHz range may be used to power the plasma. In various embodiments, any duty ratio (e.g., 0.1% to 99.9%) may be used for any plasma tool. In certain embodiments, a moderate duty ratio between 10% to 70% or 10% to 80% may be used for capacitively coupled plasma (CCP), and 3% to 90% for inductively coupled plasma (ICP). In one embodiment, a sinusoidal RF signal of 1 MHz may be modulated with an on-off frequency of 100 Hz. In another embodiment, a DC signal may be modulated with an on-off frequency of 100 Hz. In yet another embodiment, a square DC pulse signal of 1 MHz may be modulated with an on-off frequency of 100 Hz. In an alternate embodiment, cyclic modulation of RF or fast DC pulse waveform may be performed at a lower frequency (e.g., <100 Hz) using an algorithm.

Various configurations may be used for a plasma processing system 10 that is equipped with the OES detection device 145. For example, the plasma processing system 10 may be a capacitively coupled plasma (CCP) system, as illustrated in FIG. 1, or an inductively coupled plasma (ICP) plasma system. In alternate embodiments, the plasma processing system 10 may comprise a resonator such as a helical resonator. Further, microwave plasma (MW) or other suitable systems may also be used. In various embodiments, the RF power, chamber pressure, substrate temperature, gas flow rates and other plasma process parameters may be selected in accordance with the respective process recipe.

Figure 2:
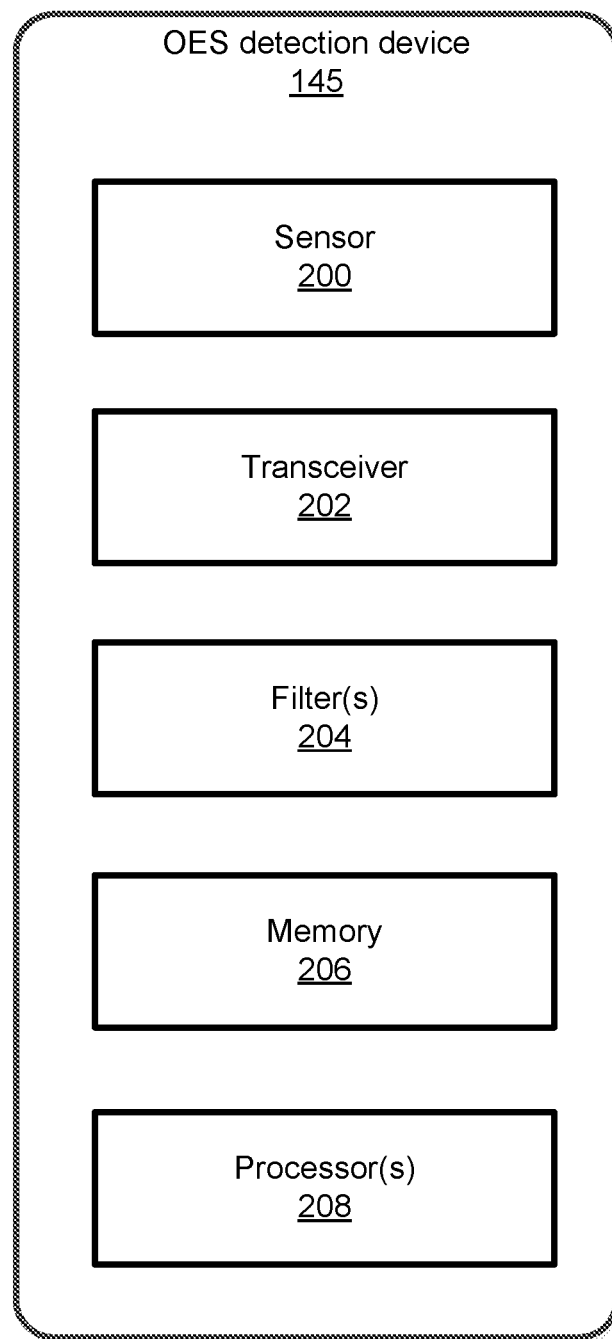
FIG. 2 illustrates a schematic diagram of an OES detection device and their components in accordance with various embodiments.

FIG. 2 illustrates a schematic diagram of an OES detection device 145 and their components in accordance with various embodiments.

The OES detection device 145 may comprise a sensor 200, a transceiver 202, a filter 204, a memory 206, and a processor 208. In various embodiments, the OES detection device 145 may be configured to receive a command from the control unit 155 (FIG. 1) and perform a series of operations accordingly: OES data acquisition at the sensor, receiving the OES data at the transceiver 202, filtering the OES data at the filter 204, and determining a characteristic of the plasma at the processor 208. The characteristic of the plasma may, for example, be plasma density, and/or concentrations of reactive ion species, etch by-product, or other species of interest. The characteristic of the plasma may also include information on electron temperature. In certain embodiments, the OES detection device 145 may be further configured to process the obtained OES data by, for example, averaging and/or smoothing prior to determining the characteristic of the pulsed plasma.

In acquiring the OES data, the sensor 200 may include, for example, a spectrometer that samples an optical emission spectrum of a plasma. The spectrum, in this example, may include light intensity as a function of wavelength or frequency. The sensor 200 may comprise a charge-coupled device (CCD) sensor, a complementary metal oxide semiconductor (CMOS) image sensor, or other type of light detection device or photosensor may be utilized to measure the light intensity at a plasma processing chamber of the plasma processing system 20. In certain embodiments, the sensor 200 may comprise a CCD sensor with a capability of millisecond time resolution. In another embodiment, the sensor 200 may comprise a CMOS image sensor with a capability of microsecond time resolution.

In various embodiments, the memory 206 may comprise a non-statutory computer-readable storage media for storing instructions which are executed by the processor 208 to perform the various functions described herein. For example, the memory 206 may generally include both volatile memory and non-volatile memory (e.g., RAM, ROM, or the like). The memory 206 may be referred to as memory or computer-readable storage media herein. The memory 206 is capable of storing computer-readable, processor-executable program instructions as computer program code that may be executed by the processor(s) 208 as a particular machine configured for carrying out the operations and functions described in the implementations herein.

The OES detection device 145 is capable of collecting a plurality of wavelengths of optical emission spectra emanating from the glow discharge of gases in the plasma processing chamber. These wavelengths can be associated with the specific chemical species generated from entering reactant gases, can result from gas phase reactions as well as reactions on the wafer and chamber surfaces. The OES detection device 145 may be configured to detect various chemical species including halides of silicon and the halogen species itself (e.g. Cl, F, and Br). In one or more embodiments, the plasma process may comprise etching of silicon oxide using a fluorine-containing chemistry, such as a fluorocarbon or hydrofluorocarbon gas. In such embodiments, it is useful to dynamically detect halides of silicon and the halogen species (F) that are released by the decomposition of the fluorocarbon or hydrofluorocarbon gas in order to monitor the etch process for its process and stability. Other detectable byproducts may include carbon monoxide (CO), and carbon dioxide ($CO_2$), formed by reaction of oxygen (O) from a film or gas mixture with carbon (C) from the fluorocarbon or hydrofluorocarbon gas.

The wavelengths of the optical emission spectra can also shift as the surface composition of the wafer shifts from a steady-state etch to the complete removal of the etched material. Detection of this shift may provide useful information about the plasma process, for example, for etch endpoint determination (EPD), indicating the completion of the required etch.

In various embodiments, the configuration of the OES detection device 145 may be particularly arranged for the type of plasma discharge typically used in the plasma processing system 10. For example, a range of species and wavelengths for detection may be different for high-density ICP, low-density CCP, electron cyclotron resonance (ECR) plasma, and others.

Figure 3A:
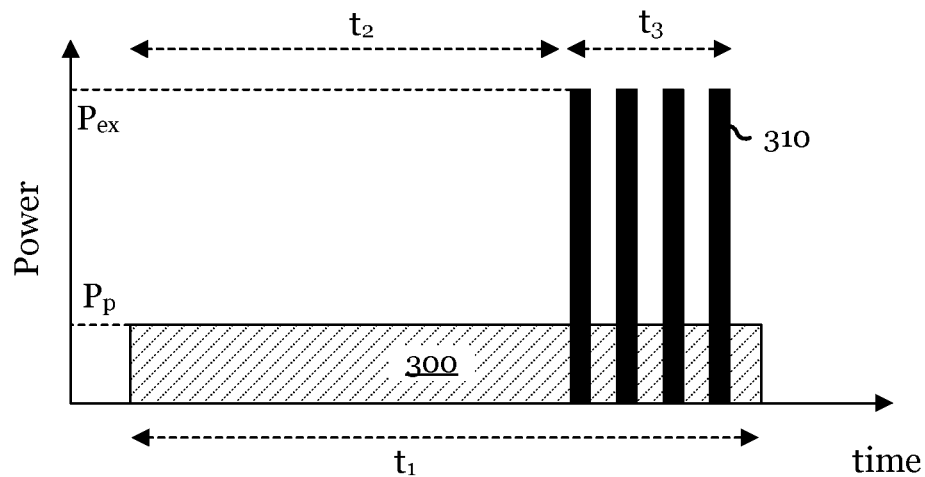
Figure 3B:
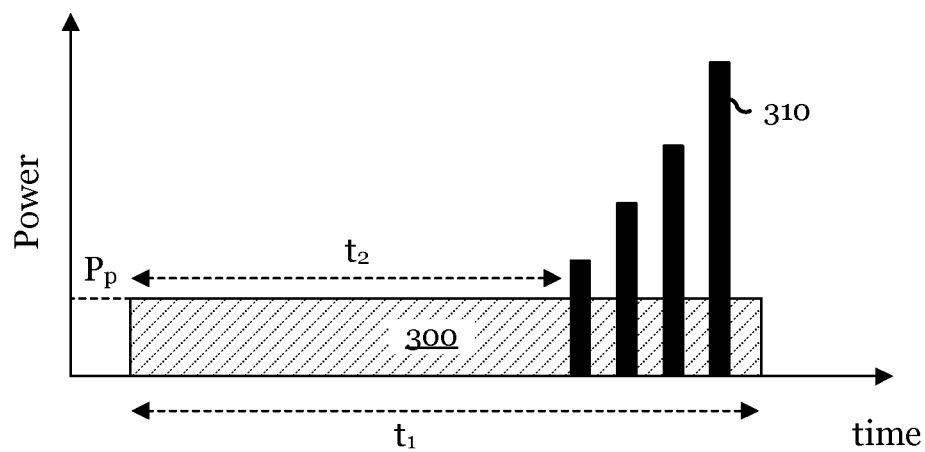
Figure 3C:
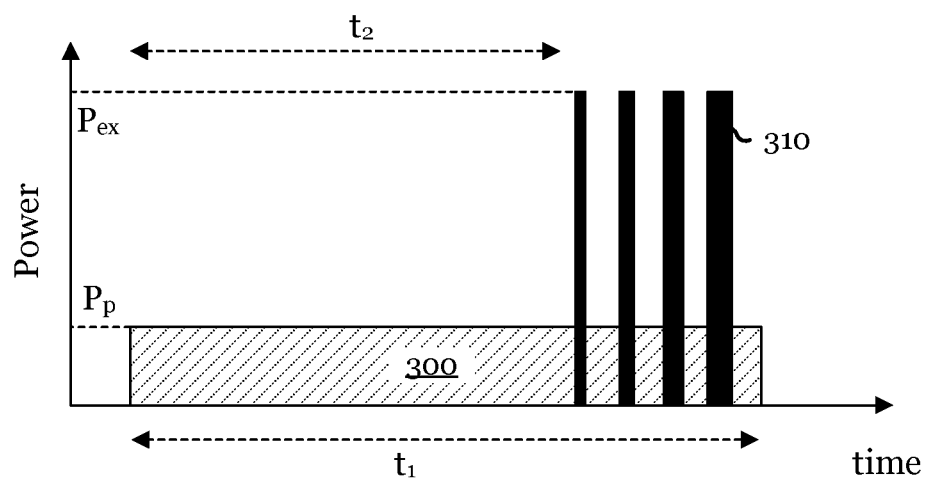

FIGS. 3A-3C illustrate example timing diagrams for a plasma process synchronized with power pulsing for OES signal enhancement in accordance with various embodiments.

In various embodiments, the methods of OES data collection apply short duty power spikes near the end of the plasma process in order to enhance the OES signal intensity. The collected OES data may be provided to an algorithm to perform EPD analysis. These power spikes are configured to provide enough power for OES signal enhancement without causing a substantial interference to the plasma process.

In FIG. 3A, the plasma for the plasma process is sustained in a plasma processing chamber by a source power 300 provided for a time period $t_1$ at a constant power level $P_p$. In various embodiments, the source power 300 may be a RF power or a pulsed RF power. At any point during the plasma process (i.e., the time period $t_1$), OES data collection may be performed to characterize the plasma and evaluate the progress of the plasma process. Such characterization can be particularly important near the end of the plasma process for the purpose of endpoint detection (EPD). However, some process conditions requires a low power level that leads to very mild, or no excitation power ("plasma-less" processes). This poses a challenge of insufficient excitation for optical emissions spectroscopy (OES).

To overcome this challenge of poor OES signal intensity, a series of power spikes 310 may be provided to the plasma processing chamber. These additional power spikes may be provided by powering one or more power sources of the plasma processing chamber (e.g., any one or more of the RF power sources 140, 142, and 144 in FIG. 1). In certain embodiments, it may be the same as the power source used for the source power 300. In other embodiments, it may be a different power source (e.g., bias power source), or a combination thereof. In one or more embodiments, the plasma processing system may comprise a power source dedicated to the OES detection device that may be configured to operate independently from any existing source/bias power sources.

In FIG. 3A, four power spikes at a power level $P_{ex}$ are illustrated as an example. In various embodiments, the power spikes 310 may generally be required to satisfy the following criteria: (1) the power level $P_{ex}$ is sufficiently higher than the power level $P_p$ to enable OES signal intensity enhancement in response to the power spikes; and (2) the total energy provided by the power spikes 310 (i.e., the product of power and time) is substantially lower than the total energy provided by the source power 300 such that the addition of the power spikes 310 does not significantly interfere with the plasma process. In general, more additional energy to the plasma will enable greater OES signal enhancement, but it will result in a greater risk of interfering the plasma process. Therefore, in various embodiments, the process conditions for the power spikes 310 may be carefully selected to balance the two requirements. In certain embodiments, the total energy provided by the power spikes 310 is at most 50% of the total energy provided by the source power 300 during the plasma process. In other words, the total energy of the power spikes 310 is less than the energy of the source power 300 during the plasma process by a factor of at least 2. This factor between the two energies may, in another embodiment, be at least 5, or at least 10 in yet another embodiment. In alternate embodiments, the factor may be between 20 and 1000.

To satisfy the criterion (2) above, the addition of the power spikes 310 may be started only after a majority of the expected process time has passed (e.g., after a time period $t_2$). For example, $t_2$ may be between about 10% and 99% of $t_1$ in one embodiment, or between 80% and 99% of $t_1$ in another embodiment. In other words, the series of the power spikes 310 may be provided during a time period $t_3$ as illustrated in FIG. 3A, which is substantially shorter than the time period $t_1$ and near the end of the plasma process. In certain embodiments, $t_2$ represents a majority of the plasma process time and may be between 2 sec and 1200 sec.

In various embodiments, each of the power spikes 310 provides power for a short excitation time $\tau_{ex}$, for example, between 0.1 ms and 5 s. In certain embodiments, $\tau_{ex}$ may be between 0.1 ms and 1 s. Short excitation time $\tau_{ex}$ may advantageously minimize a potential interference to the plasma process with the power spikes 310. Further, in one or more embodiments, the excitation time $\tau_{ex}$ may be shorter than the OES time resolution (i.e., time required to perform one OES measurement). In other embodiments, the excitation time $\tau_{ex}$ may be longer than the OES time resolution.

In certain embodiments, a series of power spikes may be applied by a power pulse train having a frequency, for example, in the range of 1 Hz and 10 kHz, for the time period $t_3$. In one or more embodiments, $t_3$ may be a half of $t_2$ or less. In other embodiments, $t_1$ is longer than $t_3$ by a factor of at least 2. This factor, in another embodiment, may be at least 5, or in yet another embodiment, may be at least 10.

Further, in various embodiments, the criterion (2) may be ensured by applying power conditions: $P_{ex} \times D \ll P_p$, where D is a duty ratio for the power spikes 310. In certain embodiments, $P_{ex} \times D$ may be at most 50% of $P_p$, or in other embodiments, between 0.1% and 10%. In alternate embodiments, however, a high additional power condition, where $P_{ex} \times D$ may be greater than 50% of $P_p$, may be used. In certain embodiments, D may be between 0.1% and 50%.

OES data collection may be performed in synchronization with the power spikes 310. In various embodiments, the timing of each OES measurement may be synchronized with each of the power spikes 310 with a delay. Having the delay in synchronization may be advantageous in obtaining more stable OES signals at fully excited phase rather than a transitory phase where the excitation process is still in progress. The duration of delay may be determined according to discharge conditions and the power matching unit. In certain embodiments, the delay may be between 10 μs and a few seconds.

Although four spikes are illustrated in FIG. 3A, the number of power spikes 310 is not limited to any number. Similarly, the number of OES measurements during one cycle of the OES data collection is not limited to any number, and may or may not be equal to the number of the power spikes 310. For example, the excitation time $\tau_{ex}$ (e.g., >1 s) and the OES time resolution (e.g., <10 ms) may differ by orders of magnitude. In one embodiment, several power spikes with the excitation time $\tau_{ex}$ of a few seconds are used, and more than hundreds of OES measurements may be continuously repeated during the time period $t_3$.

In addition, while the constant power level with constant duty ratio (i.e., constant excitation time $\tau_{ex}$) are illustrated in FIG. 3A, various power pulse patterns may be used for OES signal enhancement.

FIG. 3B illustrates another example timing diagrams for a plasma process synchronized with power pulsing and ramping for OES signal enhancement in accordance with another embodiment.

In FIG. 3B, the power spikes 310 comprises spikes with power ramping, from a lower power level to a higher power level. In one embodiment, as illustrated in FIG. 3G, the excitation power level for the power spikes 310 may be ramped for each spike stepwise. Such excitation power modulation during the OES data collection time period can provide additional information on the plasma and thereby the progress of plasma process. This may be particularly advantageous in characterizing more than one species that have different emission characteristics. Excitation power modulation may also be useful, when an optimal excitation power level for OES is not established beforehand, to dynamically determine the excitation power level necessary to achieve a target OES signal intensity.

FIG. 3C illustrates yet another example timing diagrams for a plasma process synchronized with power pulsing for OES signal enhancement in accordance with yet another embodiment.

In FIG. 3C, the power spikes 310 comprises spikes with varying duty ratio with a constant excitation power level. In the illustrated example, the excitation time $\tau_{ex}$ (i.e., the duty ratio for power pulsing for OES signal enhancement) is increased with time. Providing an increasing amount of energy to the plasma, such excitation power duty ratio modulation may advantageously have a similar effect on OES as increasing the power level as illustrated in FIG. 3B.

In various embodiments, the power pulsing for OES signal enhancement may be modulated in terms of both power level and duty ratio at the same time. Further, the excitation power modulation is not limited to a monotonic increase or decrease. In one embodiment, for example, the power level, duty ratio, or both may be modulated periodically.

Based on the improved OES data collection through the power pulsing, the methods may be implemented to an algorithm of endpoint detection (EPD). In certain embodiments, the endpoint of the plasma process may be determined using a principal component analysis (PCA) such as Fusion algorithm as described in the reference application (i.e., U.S. application Ser. Nos. 61/715,047, 14/056,059 (U.S. Pat. No. 9,330,990), and Ser. No. 15/053,368 (U.S. Pat. No. 10,002,804)), or by using non-PCA method in other arts. For example, EPD may be performed based on a raw or smoothened average of the series of OES data.

Figure 4A:
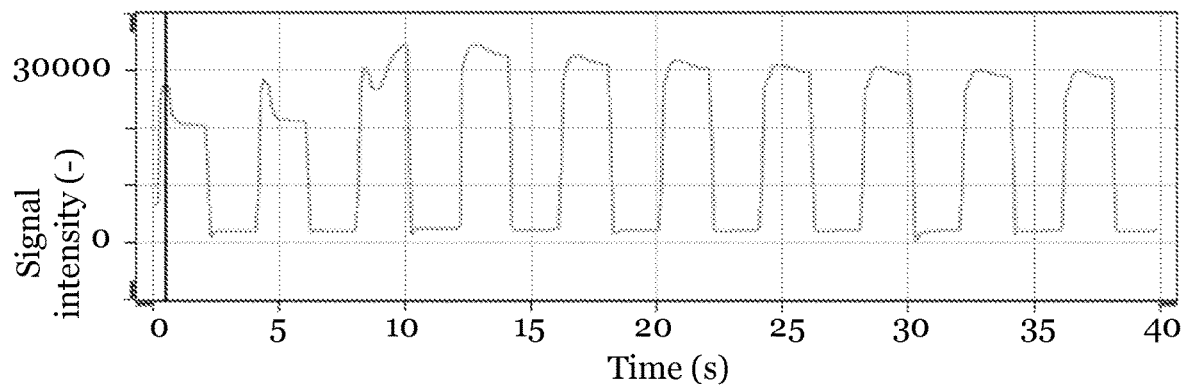
Figure 4B:
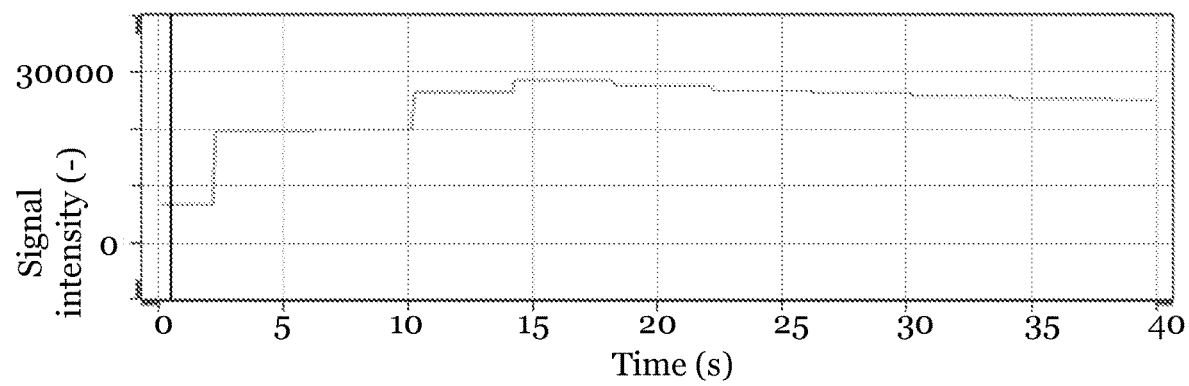
Figure 4C:
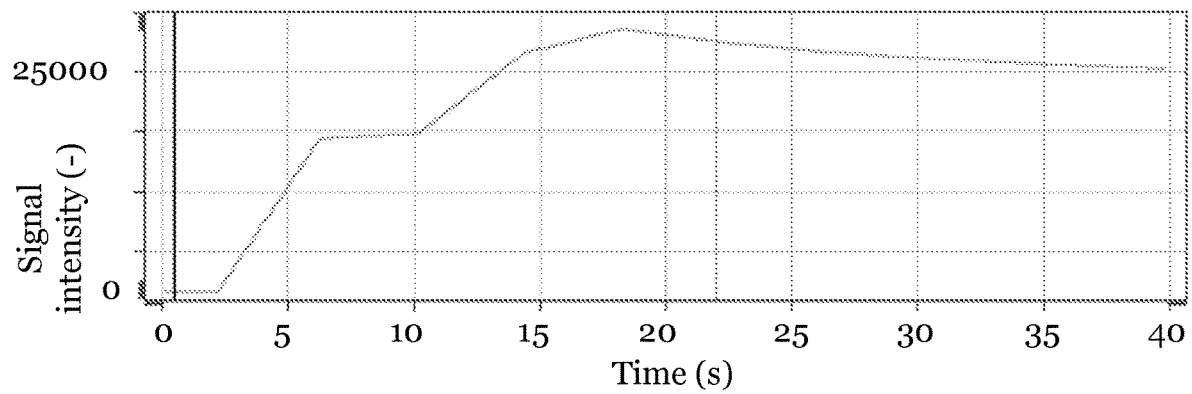

FIGS. 4A-4C illustrate example experimental data obtained by the method for OES data collection with power pulsing (4 s cycle) in accordance with one embodiment. FIG. 4A illustrates a temporal profile of raw OES signal intensity at 777 nm for detection of oxygen, FIG. 4B illustrates a plot of the processed data of FIG. 4A with stepwise transitions, and FIG. 4C illustrates a plot of the processed data of FIG. 4A with smooth curve transitions.

Through some experiments, the inventors of this application demonstrated the feasibility of the method of OES data collection with power pulsing for EPD. An $O_2$ plasma etch process to remove an organic planarization layer (OPL) was performed and the plasma was characterized with OES. Two sets of power pulsing for OES signal enhancement were tested: 4 s cycle (FIGS. 4A-4C) and 7 s cycle (FIGS. 5A-5C). In the first example with 4 s cycle, the power spikes were provided with an excitation time of 2.2 s for a 4 s power pulse cycle (duty ratio of 55%). OES data were collected continuously for a period of 40 s, and the signal intensity at 777 nm was analyzed for detection of oxygen. As can be seen in FIG. 4A, the OES signal intensity reflected the general pattern of the power pulsing (i.e., 4 s cycle with 55% duty ratio), where significant OES signal was recorded only when the power spikes were provided. This result confirms the OES enhancement by the power pulsing applied. First few peaks were less symmetrical than the rest of the peaks, suggesting more dynamic change in oxygen species in the plasma during the first half of the process period. Further data analysis was performed by averaging the signal intensity for these discrete peaks. The peak intensity was averaged for each peak, and the resulting average peak intensity for each peak is assumed to represent the corresponding period of each pulse cycle (i.e., 4 s). With this assumption, the signal-missing portions in FIG. 4A may be supplemented. This averaged peak intensity was plotted with stepwise transitions (FIG. 4B) and smooth curve transitions (FIG. 4C). In FIG. 4B, the envelope of the profile of FIG. 4A is extracted using a software algorithm, while in FIG. 4C, the moving average is applied and the stepwise transition of FIG. 4B is replaced with a smooth curve transition made of a number of straight lines. The temporal analysis of OES data collected with power pulsing may be used to estimate an endpoint of the process. For example, the differential function of the averaged peak intensity may be derived from the plot of FIG. 4C (smooth curve transitions), and a process queue (set of instructions) may be applied to determine the endpoint. In the illustrated example, the endpoint was estimated at around 22 s.

FIGS. 5A-5C illustrates example experimental data obtained by the method for OES data collection with power pulsing (7 s cycle) in accordance with one embodiment, wherein FIG. 5A illustrates a temporal profile of raw OES signal intensity at 777 nm for detection of oxygen, FIG. 5B illustrates a plot of the processed data of FIG. 5A with stepwise transitions, and FIG. 5C illustrates a plot of the processed data of FIG. 5A with smooth curve transitions. The details of experiments and analytical procedures are the same as those in FIGS. 4A-4C, and therefore will not be repeated.

In the second example with 7 s cycle, the power spikes were provided with an excitation time of 2.2 s for a 7 s power pulse cycle (duty ratio of 31%). A similar peak pattern as FIG. 4A was obtained, reflecting the general pattern of the power pulsing (i.e., 7 s cycle with 31% duty ratio), where significant OES signal was recorded only when the power spikes were provided. The signal-missing portions in FIG. 5A were supplemented by averaging the peak intensity and FIGS. 5B and 5C were plotted. Based on them, the temporal analysis of OES data collected with power pulsing allowed the estimation of the endpoint at around 25.2 s. This estimated endpoint is reasonably later than the first example (i.e., 22 s) illustrated in FIGS. 4A-4C, since the second example employed the lower duty ratio for the power spikes.

FIGS. 6A and 6B illustrate process flow charts of methods of OES data collection in accordance with various embodiments.

In FIG. 6A, a process flow 60 starts with exposing a substrate in a plasma processing chamber to a plasma powered by applying a first power to a first electrode of the plasma processing chamber for a first time duration (block 610) Next, after the first time duration, a process endpoint may be determined (block 630) with the following steps: applying a second power, while exposing the substrate to the plasma by applying the first power to the first electrode, to a second electrode of the plasma processing chamber for a second time duration to increase optical emissions from the plasma (block 631), and obtaining an optical emission spectrum (OES) from the plasma with the increased optical emissions (block 635).

In FIG. 6B, a process flow 62 starts with exposing a substrate in a plasma processing chamber to a plasma powered by applying a first power to a first electrode of the plasma processing chamber for a first time duration (block 610), followed by applying a second power comprising a waveform having a frequency while exposing the substrate to the plasma by applying the first power to the first electrode (block 632). Next, optical emission spectra (OES) may be periodically detected from the plasma, where the OES are detected at time periods correlated to the frequency of the waveform (block 634). Subsequently, based on the periodic detection of the OES, a process endpoint may be detected (block 636).

Example embodiments of the invention are summarized here. Other embodiments can also be understood from the entirety of the specification as well as the claims filed herein.

Example 1. A method of processing a substrate that includes: exposing the substrate in a plasma processing chamber to a plasma powered by applying a first power to a first electrode of the plasma processing chamber for a first time duration; and after the first time duration, determining a process endpoint, the determining including: while exposing the substrate to the plasma by applying the first power to the first electrode, applying a second power to a second electrode of the plasma processing chamber for a second time duration, the second time duration being shorter than the first time duration; and obtaining an optical emission spectrum (OES) from the plasma while applying the second power to the second electrode, where an energy of the second power over the second time duration is less than an energy of the first power over a sum of the first time duration and the second time duration by a factor of at least 2.

Example 2. The method of example 1, where the first electrode and the second electrode are a same electrode.

Example 3. The method of one of examples 1 or 2, where the first time duration is between 2 sec and 1200 sec.

Example 4. The method of one of examples 1 to 3, where the second time duration is between 0.1 ms and 1 sec.

Example 5. The method of one of examples 1 to 4, where the determining includes performing a principal component analysis.

Example 6. The method of one of examples 1 to 5, where the first power is applied as a RF power.

Example 7. The method of one of examples 1 to 6, where the first power is applied as a pulsed RF power.

Example 8. A method of processing a substrate with a plasma process that includes: exposing the substrate in a plasma processing chamber to a plasma powered by applying a first power to a first electrode of the plasma processing chamber; while exposing the substrate to the plasma by applying the first power to the first electrode, applying a second power including a waveform having a frequency; periodically detecting optical emission spectra (OES) from the plasma, the OES being detected at time periods correlated to the frequency of the waveform; and detecting a process endpoint based on the periodic detection of the OES.

Example 9. The method of example 8, where the waveform includes a plurality of maximums, where the timing of the OES detection for one of the periodically detecting is matched with one of the plurality of maximums.

Example 10. The method of one of examples 8 or 9, where the waveform includes a plurality of maximums, where the timing of the OES detection for one of the periodically detecting is offset from one of the plurality of maximums.

Example 11. The method of one of examples 8 to 10, where the first power is applied over a first time duration and where the second power is applied over a second time duration, the first time duration being at least 2 times the second time duration.

Example 12. The method of one of examples 8 to 11, where the first power is applied over a first time duration and where the second power is applied over a second time duration, an energy of the second power is less than an energy of the first power by a factor of at least 2.

Example 13. The method of one of examples 8 to 12, where the waveform has a duty ratio between 0.1% and 50%.

Example 14. The method of one of examples 8 to 13, where the frequency is between 1 Hz and 10 kHz.

Example 15. A plasma processing system including: a plasma processing chamber configured to hold a substrate to be processed; a RF power source configured to sustain a plasma in the plasma processing chamber; an optical emission spectroscopy (OES) detection device connected to the plasma processing chamber, the OES detection device being configured to measure OES signals from the plasma during a plasma process; a microprocessor; and a non-transitory memory storing a program to be executed in the microprocessor, the program including instructions to: power the RF power source to sustain the plasma using a RF source power for a first time duration; and perform a process endpoint detection, the process endpoint detection including: while sustaining the plasma with the RF source power, apply a series of power pulses to an electrode of the plasma processing chamber for a second time duration, where a total energy of the series of power pulses over the second time duration is less than an energy of the RF source power over the first time duration by a factor of at least 2; detecting a series of optical emission spectra (OES) from the plasma, a timing of the OES detection being correlated to a timing of power pulses; and determine if the process has reached to the endpoint based on the series of OES.

Example 16. The plasma processing system of example 15, where the OES detection device has a time resolution for detection of less than 100 ms.

Example 17. The plasma processing system of one of examples 15 or 16, where the the total energy of the series of power pulses over the second time duration is less than the energy of the RF source power over the first time duration by a factor of at least 10.

Example 18. The plasma processing system of one of examples 15 to 17, where the electrode is connected to and configured to power the RF power source.

Example 19. The plasma processing system of one of examples 15 or 18, where the program further includes an instruction to terminate the plasma if the process is determined to have reached the endpoint.

Example 20. The plasma processing system of one of examples 15 to 19, where the program further includes instructions to repeat the process endpoint detection after a set period of time if the process is determined not to have reached the endpoint.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
exposing the substrate in a plasma processing chamber to a plasma powered by applying a first power to a first electrode of the plasma processing chamber for a first time duration; and after the first time duration, determining a process endpoint, the determining comprising:
  while exposing the substrate to the plasma by applying the first power to the first electrode, applying a second power to a second electrode of the plasma processing chamber for a second time duration, the second time duration being shorter than the first time duration; and
  obtaining an optical emission spectrum from the plasma while applying the second power to the second electrode, wherein an energy of the second power over the second time duration is less than an energy of the first power over a sum of the first time duration and the second time duration by a factor of at least 2.

2. The method of claim 1, wherein the first electrode and the second electrode are a same electrode.

3. The method of claim 1, wherein the first time duration is between 2 sec and 1200 sec.

4. The method of claim 1, wherein the second time duration is between 0.1 ms and 1 sec.

5. The method of claim 1, wherein the determining comprises performing a principal component analysis.

6. The method of claim 1, wherein the first power is applied as an RF power.

7. The method of claim 1, wherein the first power is applied as a pulsed RF power.

8. A method of processing a substrate with a plasma process, the method comprising:
  exposing the substrate in a plasma processing chamber to a plasma powered by applying a first power to a first electrode of the plasma processing chamber;
  while exposing the substrate to the plasma by applying the first power to the first electrode, applying a second power comprising a waveform having a frequency, wherein the first power is applied over a first time duration and wherein the second power is applied over a second time duration, the first time duration being at least 2 times the second time duration;
  periodically detecting optical emission spectra from the plasma, the optical emission spectra being detected at time periods correlated to the frequency of the waveform; and
  detecting a process endpoint based on the periodic detection of the optical emission spectra.

9. The method of claim 8, wherein the waveform comprises a plurality of maximums, wherein the timing of detecting the optical emission spectra for one of the periodically detecting is matched with one of the plurality of maximums.

10. The method of claim 8, wherein the waveform comprises a plurality of maximums, wherein the timing of detecting the optical emission spectra for one of the periodically detecting is offset from one of the plurality of maximums.

11. A method of processing a substrate with a plasma process, the method comprising:
  exposing the substrate in a plasma processing chamber to a plasma powered by applying a first power to a first electrode of the plasma processing chamber;
  while exposing the substrate to the plasma by applying the first power to the first electrode, applying a second power comprising a waveform having a frequency, wherein the first power is applied over a first time duration and wherein the second power is applied over a second time duration, an energy of the second power is less than an energy of the first power by a factor of at least 2;
  periodically detecting optical emission spectra from the plasma, the optical emission spectra being detected at time periods correlated to the frequency of the waveform; and
  detecting a process endpoint based on the periodic detection of the optical emission spectra.

12. The method of claim 8, wherein the waveform has a duty ratio between 0.1% and 50%.

13. The method of claim 8, wherein the frequency is between 1 Hz and 10 kHz.

14. The method of claim 8, wherein the first power is applied over a first time duration and wherein the second power is applied over a second time duration, an energy of the second power is less than an energy of the first power by a factor of at least 2.

15. The method of claim 11, wherein the waveform comprises a plurality of maximums, wherein the timing of detecting the optical emission spectra for one of the periodically detecting is matched with one of the plurality of maximums.

16. The method of claim 11, wherein the waveform comprises a plurality of maximums, wherein the timing of detecting the optical emission spectra for one of the periodically detecting is offset from one of the plurality of maximums.

17. The method of claim 11, wherein the waveform has a duty ratio between 0.1% and 50%.

18. The method of claim 11, wherein the frequency is between 1 Hz and 10 KHz.

19. The method of claim 1, further comprising:
  after applying the second power for the second time duration, applying the first power to the first electrode for a third time duration;
  after the third time duration, while exposing the substrate to the plasma by applying the first power to the first electrode, applying a third power to the second electrode of the plasma processing chamber for a fourth time duration, the fourth time duration being shorter than the first time duration and the third time duration, the third power being greater than the second power; and
    obtaining an optical emission spectrum from the plasma while applying the third power to the second electrode, wherein an energy of the third power over the fourth time duration is less than an energy of the first power over a sum of the first time duration, the second time duration, the third time duration, and the fourth time duration.

20. The method of claim 1, further comprising:
after applying the second power for the second time duration, applying the first power to the first electrode for a third time duration;
after the third time duration, while exposing the substrate to the plasma by applying the first power to the first electrode, applying a third power to the second electrode of the plasma processing chamber for a fourth time duration, the fourth time duration being shorter than the first time duration and longer than the second time duration; and
  obtaining an optical emission spectrum from the plasma while applying the third power to the second electrode, wherein an energy of the third power over the fourth time duration is less than an energy of the first power over a sum of the first time duration, the second time duration, the third time duration, and the fourth time duration.

* * * * *